(12) United States Patent
Onishi

(10) Patent No.: US 10,147,532 B2
(45) Date of Patent: Dec. 4, 2018

(54) WIRING STRUCTURE FOR ELECTRONIC APPARATUS AND IMAGE FORMING APPARATUS

(71) Applicant: CANON KABUSHIKI KAISHA, Tokyo (JP)

(72) Inventor: Masashi Onishi, Toride (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/855,420

(22) Filed: Dec. 27, 2017

(65) Prior Publication Data
US 2018/0218827 A1 Aug. 2, 2018

(30) Foreign Application Priority Data

Jan. 30, 2017 (JP) .................................. 2017-014633

(51) Int. Cl.
| | |
|---|---|
| G03G 15/00 | (2006.01) |
| H01F 27/26 | (2006.01) |
| H03H 1/00 | (2006.01) |
| H05K 1/02 | (2006.01) |
| H01B 7/08 | (2006.01) |

(52) U.S. Cl.
CPC .......... *H01F 27/266* (2013.01); *G03G 15/80* (2013.01); *H01B 7/08* (2013.01); *H03H 1/0007* (2013.01); *H05K 1/028* (2013.01); *H03H 2001/0092* (2013.01)

(58) Field of Classification Search
CPC ....................................................... G03G 15/80
USPC ............................................................ 399/90
See application file for complete search history.

(56) References Cited

U.S. PATENT DOCUMENTS

| | | | |
|---|---|---|---|
| 8,564,857 B2 | 10/2013 | Kurokawa et al. | |
| 8,587,840 B2 * | 11/2013 | Ito ......................... | G03G 15/80 358/474 |
| 8,619,273 B2 * | 12/2013 | Mukai ..................... | G03G 15/80 358/1.13 |
| 8,934,805 B2 * | 1/2015 | Ishida et al. ....... | G03G 21/1652 399/90 |

FOREIGN PATENT DOCUMENTS

| | | |
|---|---|---|
| JP | H02-308609 A | 12/1990 |
| JP | 2011-205335 A | 10/2011 |

* cited by examiner

*Primary Examiner* — William J Royer
(74) *Attorney, Agent, or Firm* — Fitzpatrick, Cella, Harper & Scinto

(57) ABSTRACT

A holder holds a first magnetic member through which a first signal cable is passed and a second magnetic member through which a second signal cable is passed. The holder holds the first magnetic member with a first holding portion including an elastic engagement portion. The holder is also provided with a second holding portion to hold the second magnetic member at a position where the second magnetic member overlaps with the first magnetic member. A restrict portion is arranged on the elastic engagement portion and configured to restrict movement of the second magnetic member held by the second holding portion.

13 Claims, 12 Drawing Sheets

FIG.1
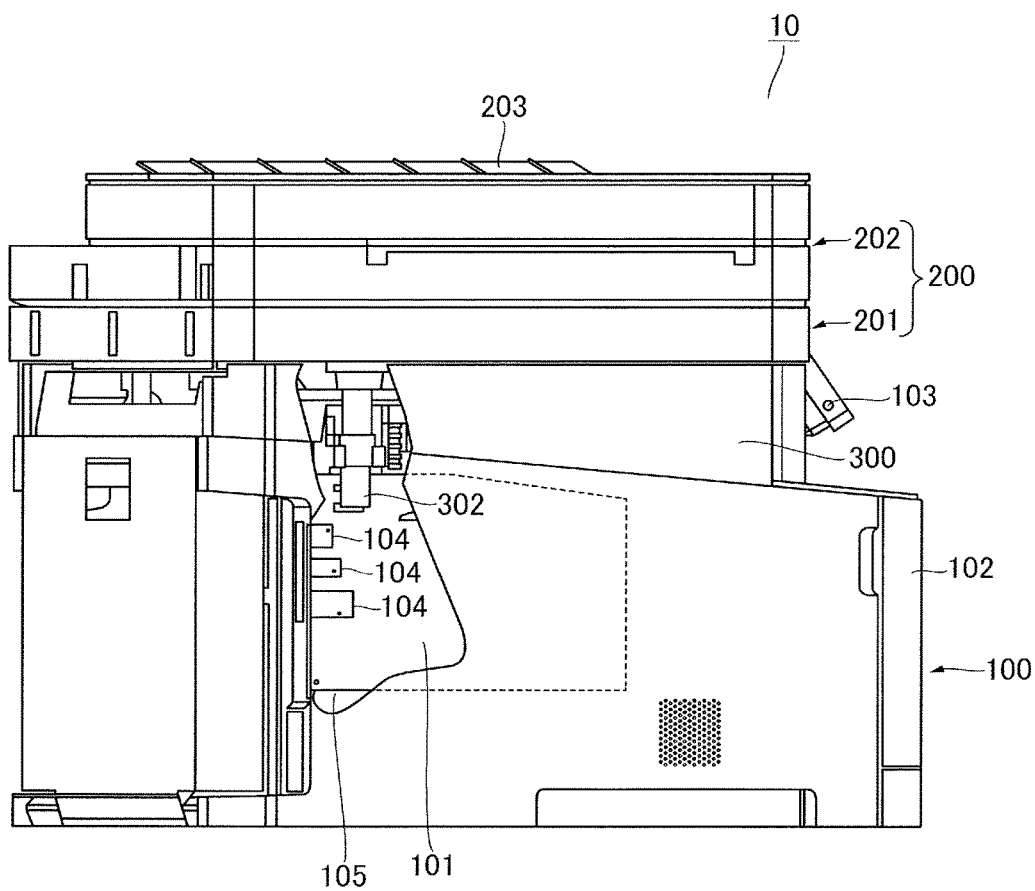
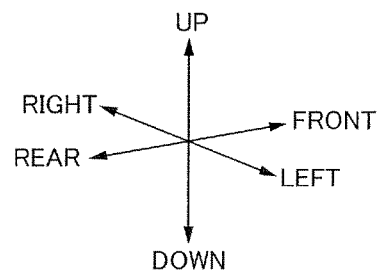

FIG.4
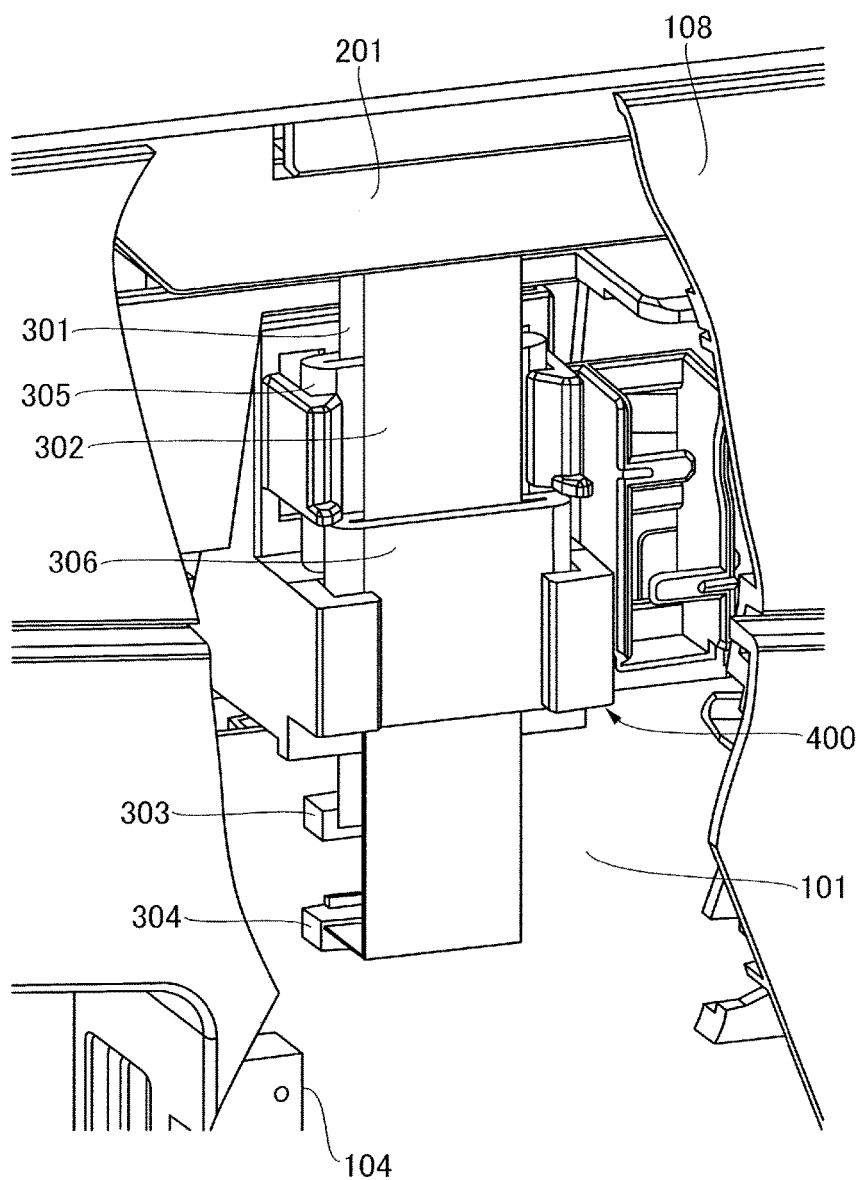
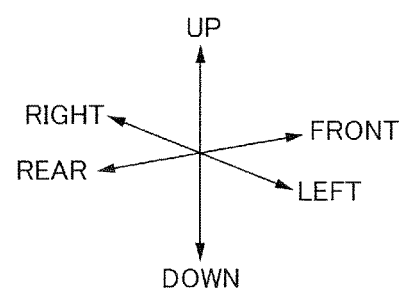

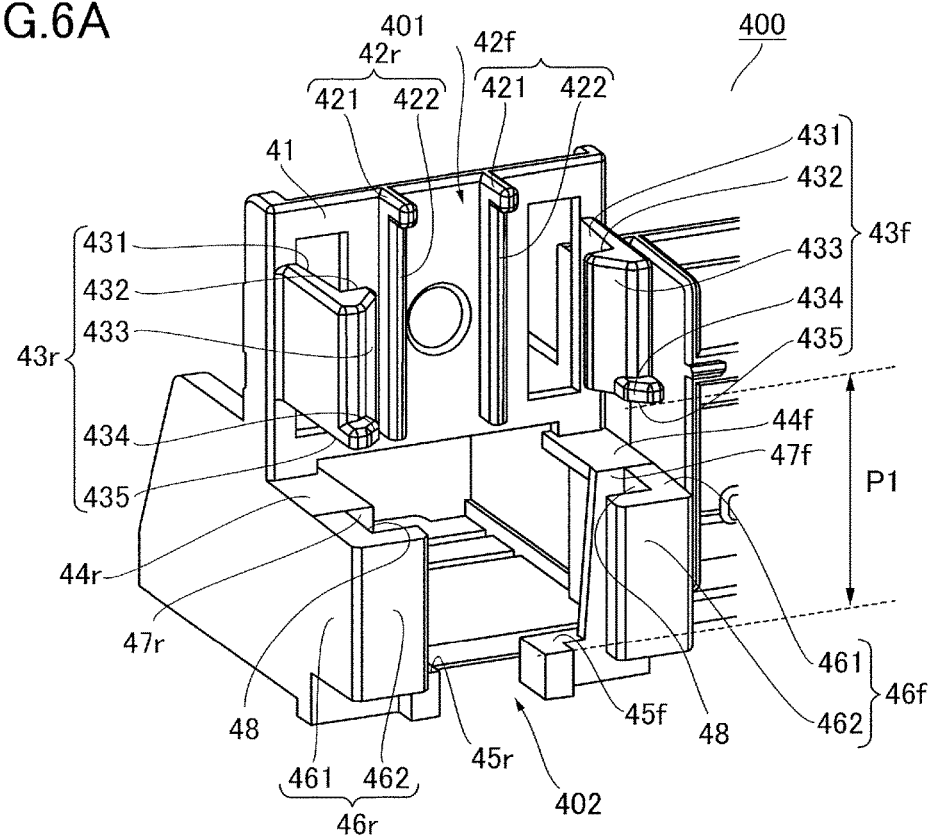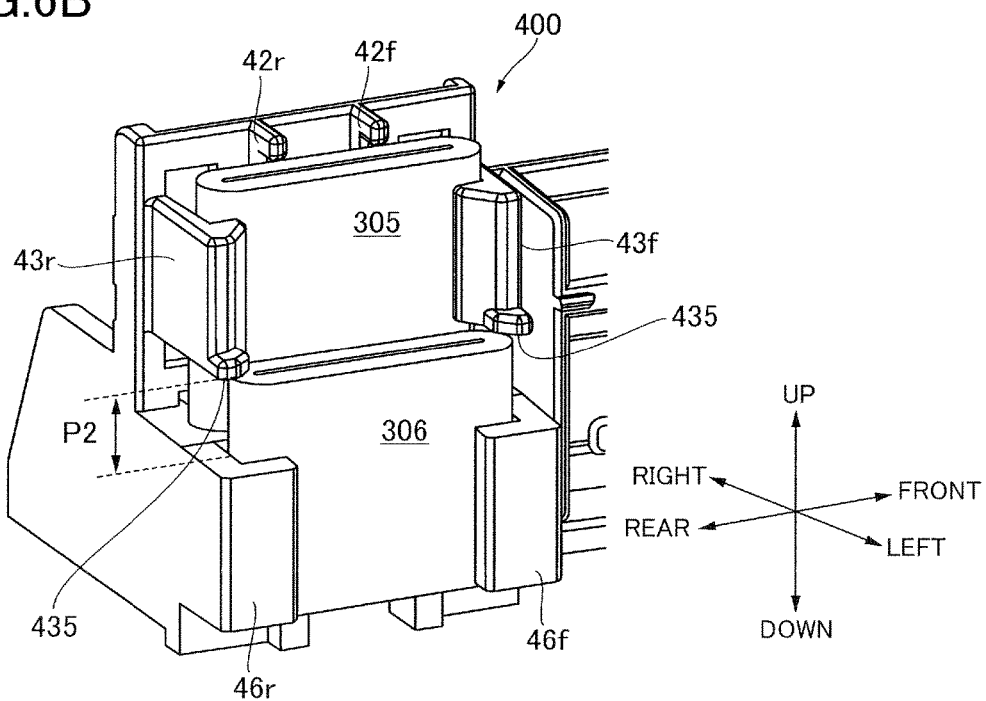

WIRING STRUCTURE FOR ELECTRONIC APPARATUS AND IMAGE FORMING APPARATUS

BACKGROUND OF THE INVENTION

Field of the Invention

The present invention relates to a wiring structure for an electronic apparatus including a noise filter, and an image forming apparatus equipped with the wiring structure.

Description of the Related Art

It has been known that noise transmitted through a signal cable wired inside an electronic apparatus can be reduced by attaching a magnetic member such as a ferrite core to the signal cable. Japanese Unexamined Patent Application Publication No. H02-308609 discloses attaching a cylindrical ferrite core to an interface cable wired inside a keyboard, and holding the ferrite core by an elastic holding claw. According to this arrangement, the holding claw is elastically deformed when the ferrite core is pushed in, so that the holding claw retains the ferrite core.

Japanese Unexamined Patent Application Publication No. 2011-205335 discloses a configuration where signals conveying image information read by two contact image sensors are transmitted through two flexible flat cables (FFC) to a control board of a multifunction printer. According to this configuration, two FFCs are respectively passed through ferrite cores, and the ferrite cores are accommodated, in a state being stacked upon one another, within a recessed portion formed on a frame member of the multifunction printer.

In order to hold a plurality of ferrite cores, it is considerable to use a holder having elasticity, such as the holding claw disclosed in the above-described Japanese Unexamined Patent Application Publication No. H02-308609. With this configuration, however, the ferrite cores might fall out of the holder when the holder is elastically deformed by causes such as external shock caused by vibration or dropping of the apparatus. Further, if the stiffness of the holder is increased to enhance the holding ability of the ferrite core, there may be drawbacks such as the deterioration of workability in attaching the ferrite core, or damaging of the ferrite core by reaction force received from the holder in a case of attaching the ferrite core.

SUMMARY OF THE INVENTION

The present invention provides a wiring structure for an electronic apparatus capable of having a magnetic member attached easily thereto and capable of improving a holding ability of the magnetic member, and an image forming apparatus equipped with the same.

According to one aspect of the present invention, a wiring structure for an electronic apparatus includes: a first signal cable and a second signal cable each configured to transmit an electronic signal; a first magnetic member which including soft magnetic material and through which the first signal cable is passed; a second magnetic member which including soft magnetic material and through which the second signal cable is passed; and a holder configured to hold the first and second magnetic members. The holder includes: a first holding portion configured to hold the first magnetic member and including an elastic engagement portion that is configured to engage with the first magnetic member by deforming elastically upon being pressed by the first magnetic member; a second holding portion to which the second magnetic member is attached in a state where the first magnetic member is held by the first holding portion, the second holding portion being configured to hold the second magnetic member at a position where the second magnetic member overlaps with the first magnetic member at a position apart from the elastic engagement portion when viewed in a moving direction of the first magnetic member in which the first magnetic member is attached to the first holding portion; and a restrict portion arranged on the elastic engagement portion and configured to restrict movement of the second magnetic member in a state where the second magnetic member is held by the second holding portion.

According to another aspect of the present invention, a wiring structure for an electronic apparatus includes: a flat first signal cable and a flat second signal cable each configured to transmit an electronic signal; a flat first magnetic member including soft magnetic material and provided with a hollow portion through which the first signal cable is passed; a flat second magnetic member including soft magnetic material and provided with a hollow portion through which the second signal cable is passed; and a holder configured to hold the first and second magnetic members with the first and second signal cables being passed. The holder includes: a first holding portion configured to hold the first magnetic member; and a second holding portion configured to hold the second magnetic member. The holder is configured such that the first and second magnetic members are held respectively by the first and second holding portions at positions overlapping with each other when viewed from a thickness direction of the first signal cable. The first holding portion includes a first elastic engagement portion and a second elastic engagement portion each elastically deformable in a width direction of the first magnetic member, where the width direction is orthogonal to both of a thickness direction and a height direction of the first magnetic member being held by the first holding portion, the first and second elastic engagement portions being configured to respectively hold one end and the other end of the first magnetic member in the width direction the first magnetic member. The second holding portion includes a thickness-direction restrict portion and a width-direction restrict portion, the thickness-direction restrict portion being configured to restrict movement of the second magnetic member in a thickness direction of the second magnetic member being held by the second holding portion, the width-direction restrict portion being configured to restrict movement of the second magnetic member in a width direction orthogonal to both of the thickness direction and a height direction of the second magnetic member being held by the second holding portion. Each of the first and second elastic engagement portions is provided with a restrict portion configured to restrict movement of the second magnetic member in the height direction of the second magnetic member in a state where the second magnetic member is held by the second holding portion.

According to still another aspect of the present invention, an image forming apparatus includes: an image forming unit configured to form an image on a sheet; and a wiring structure of the image forming apparatus. The wiring structure includes: a first signal cable and a second signal cable each configured to transmit an electronic signal; a first magnetic member which including soft magnetic material and through which the first signal cable is passed; a second magnetic member which including soft magnetic material and through which the second signal cable is passed; and a holder configured to hold the first and second magnetic members. The holder includes: a first holding portion configured to hold the first magnetic member and including an elastic engagement portion that is configured to engage with the first magnetic member by deforming elastically upon being pressed by the first magnetic member; a second holding portion to which the second magnetic member is attached in a state where the first magnetic member is held by the first holding portion, the second holding portion being configured to hold the second magnetic member at a position where the second magnetic member overlaps with the first magnetic member at a position apart from the elastic engagement portion when viewed in a moving direction of the first magnetic member in which the first magnetic member is attached to the first holding portion; and a restrict portion arranged on the elastic engagement portion and configured to restrict movement of the second magnetic member in a state where the second magnetic member is held by the second holding portion.

Further features of the present invention will become apparent from the following description of exemplary embodiments with reference to the attached drawings.

BRIEF DESCRIPTION OF THE DRAWINGS

FIG. 1 is a perspective view of an image forming apparatus according to a first embodiment.

FIG. 4 is a perspective view illustrating a wiring structure according to the first embodiment.

FIG. 6A is a perspective view of a holder according to the first embodiment.

FIG. 6B is a perspective view illustrating a state where the ferrite core is attached to the holder.

DESCRIPTION OF THE EMBODIMENTS

Figure 2:
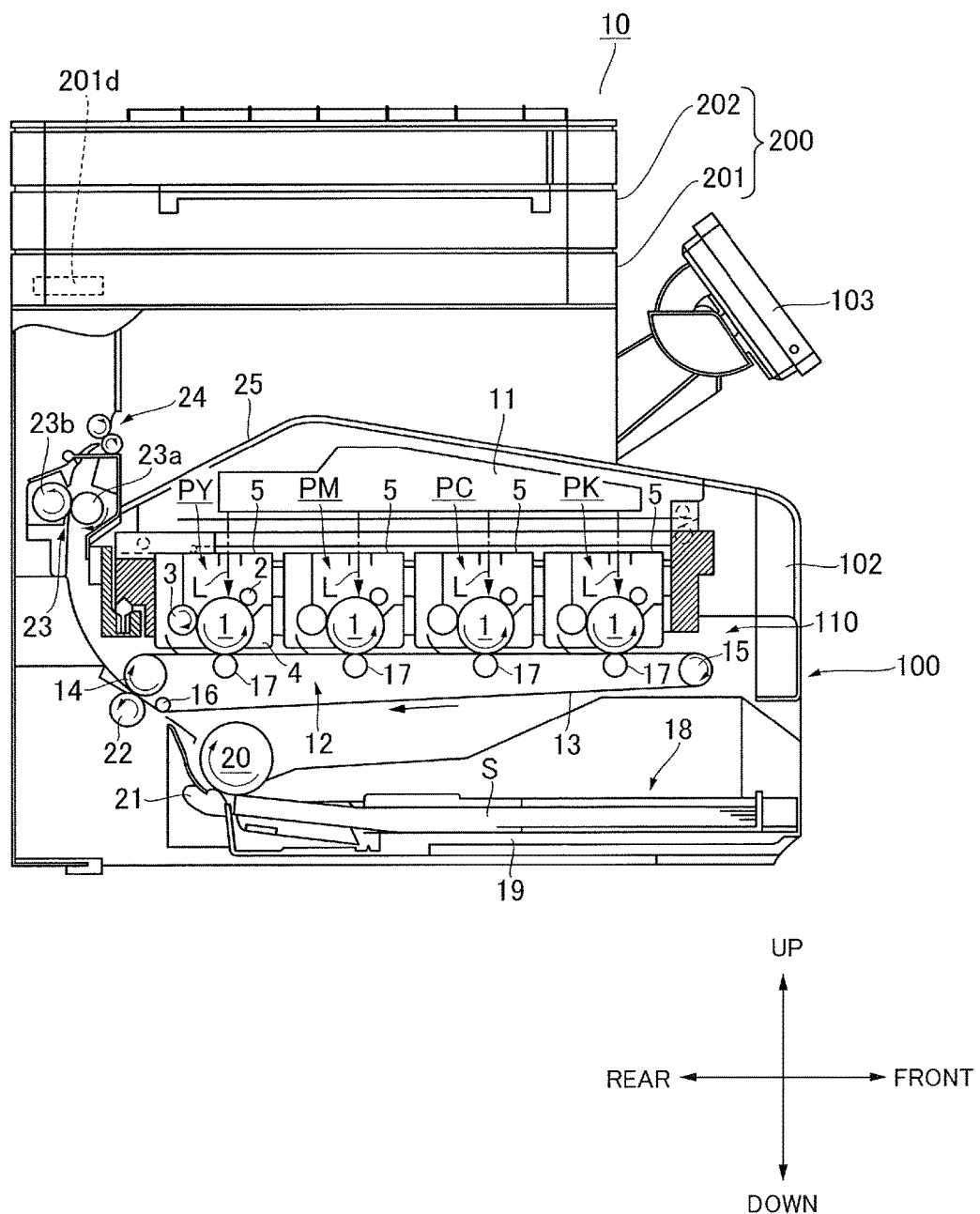
FIG. 2 is a schematic view illustrating a configuration of an image forming apparatus according to the first embodiment.

Now, an image forming apparatus and a wiring structure of the present disclosure will be described with reference to the drawings.

First Embodiment

As illustrated in FIG. 1, an image forming apparatus 10 according to a first embodiment includes an apparatus body 100, which houses an image forming unit to form an image on a sheet that serves as a recording medium, and an image reading unit 200 configured to read image information from a sheet that serves as an original, or a document. A sheet may be, in addition to plain paper, special paper such as coated paper, recording material having a special shape such as an envelope or an index paper, a plastic film such as an OHP film, cloth, and the like.

A door 102 capable of opening an inner side of the apparatus body 100 and an operation display portion 103 equipped with an operation panel serving as a user interface are provided on one side portion of the image forming apparatus 10. In the following description, the side on which the door 102 and the operation display portion 103 are arranged with respect to the image forming apparatus 10 is referred to as "front" or "front side direction", and an opposite side thereof is referred to as "rear direction". Further, right-left directions when viewed from the front side of the image forming apparatus 10 are referred to as "right" and "left" of the image forming apparatus 10, and the upper and lower directions in a state where a bottom surface of the apparatus body 100 is placed on a horizontal installation surface are referred to as "up" and "down".

A general outline of the apparatus body 100 will be described. As illustrated in FIG. 2, a tandem intermediate-transfer type image forming unit 110 including four image forming units PY, PM, PC and PK and an intermediate transfer unit 12 is accommodated within the apparatus body 100. The image forming apparatus 10 forms and an image on a sheet S based on image information acquired from the image reading unit 200 or image information entered from an external apparatus and discharges the sheet S.

The image forming units PY, PM, PC and PK described above form yellow (Y), magenta (M), cyan (C) and black (K) toner images. The image forming units PY, PM, PC and PK are respectively accommodated in frame members 5, and are configured as cartridges attached in a detachable manner to the apparatus body 100. The configurations of these image forming units PY, PM, PC and PK are basically similar, except for the different colors of the toner used for developing, so the operation of the image forming units PY, PM, PC and PK will be described taking the yellow image forming unit PY as an example.

When a toner image forming is requested to the image forming unit PY, a photosensitive drum 1 is driven to rotate, and a charging unit 2 charges the surface of the photosensitive drum 1 uniformly. An exposing unit 11 disposed on an upper portion of the apparatus body 100 irradiates the photosensitive drum 1 with a laser beam L based on the image information to expose the drum surface, and forms an electrostatic latent image on the photosensitive drum 1. Then, the toner supplied from a developing unit 3 visualizes, or develops, the electrostatic latent image, by which a toner image is formed on the surface of the photosensitive drum 1.

Similarly, toner images of corresponding colors are formed on the photosensitive drums 1 at the image forming units PM, PC and PK. Toner images formed by the respective image forming units PM, PC, PY and PK are primarily transferred by primary transfer rollers 17, being superimposed on one another, from the photosensitive drum 1 to an intermediate transfer belt 13 of the intermediate transfer unit 12. Adhered substances such as toner residing on the photosensitive drum 1 are removed by cleaning units 4 respectively provided on the image forming units PM, PC, PY and PK.

The intermediate transfer belt 13 serving as an intermediate transfer body is an endless belt member having flexibility, and is driven to rotate in a clockwise direction in FIG. 2 in a state being wound around a driving roller 14, a turn roller 15, a tension roller 16 and the like. The toner image borne on the intermediate transfer belt 13 is secondarily transferred onto a sheet S at a secondary transfer portion formed by a secondary transfer roller 22 opposed to the driving roller 14 and the intermediate transfer belt 13. The sheet S onto which the toner image has been transferred is delivered to a fixing unit 23. The fixing unit 23 includes a heating roller 23a, a pressure roller 23b, and a heat source not shown, by which heat and pressure is applied to the toner image while the sheet S is being nipped and conveyed. Thereby, the toner is melted and adhered, and the image is fixed to the sheet S.

Simultaneously as the above-described toner image forming operation, a sheet feeding unit 18 disposed at a lower portion of the apparatus body 100 performs a sheet feeding operation to feed the sheet S toward the image forming unit 110. The sheet feeding unit 18 includes a tray 19 serving as a sheet storage unit, and a feed roller 20 configured to feed the sheet S from the tray 19. The sheet S sent out by the feed roller 20 is conveyed one sheet at a time to the secondary transfer portion in a state being separated from the other sheets by a separation pad 21. The feed roller 20 and the separation pad 21 are an example of a sheet feed unit capable of feeding the sheets in a separated state, and they can be replaced with other sheet feed mechanisms such as a retard roller system or an air sheet feed system.

The sheet S is sent out toward the secondary transfer portion, along with the advancement of a toner image forming operation performed by the image forming unit 110. The sheet S onto which an image has been formed by passing the secondary transfer portion and the fixing unit 23 is discharged by a sheet discharge roller pair 24 onto a sheet discharge tray 25 provided on an upper portion of the apparatus body 100. It is noted that the above-mentioned image forming unit 110 is an example of an image forming unit capable of forming an image on a sheet, and it can be replaced with other types of image forming mechanisms, such as a direct transfer system or an ink-jet printing system.

As illustrated in FIG. 1, a control board 101 used for controlling operation of the image forming apparatus 10 is arranged on a left side portion of the apparatus body 100, and fixed to a metal plate 105 forming a frame member of the apparatus body 100. A control circuit including a central processing unit (CPU) configured to perform integrated control of respective units of the image forming apparatus 10 by executing a control program and a memory serving as a memory means for storing control programs and various data is formed on the control board 101. The control circuit is connected via connecters provided on the control board 101 to another control board to control the operation of the image forming unit 110, the operation display portion 103, the image reading unit 200, and the like. Further, a plurality of external connectors 104 as connection interfaces for connection to external apparatuses such as personal computers and networks such as telephone circuits are provided on the control board 101.

Image Reading Unit

Next, a configuration of the image reading unit 200 will be described. As illustrated in FIG. 1, the image reading unit 200 is placed on an upper face of the apparatus body 100, and fixed to the apparatus body 100 through a metal plate constituting a column portion 300 of the apparatus body 100. The image reading unit 200 is composed of a scanner unit 201, and an auto document feeder (hereinafter referred to as ADF) 202 supported on the scanner unit 201. The ADF 202 can be opened and closed with respect to the scanner unit 201 by a hinge provided on a rear end portion.

Figure 3A:
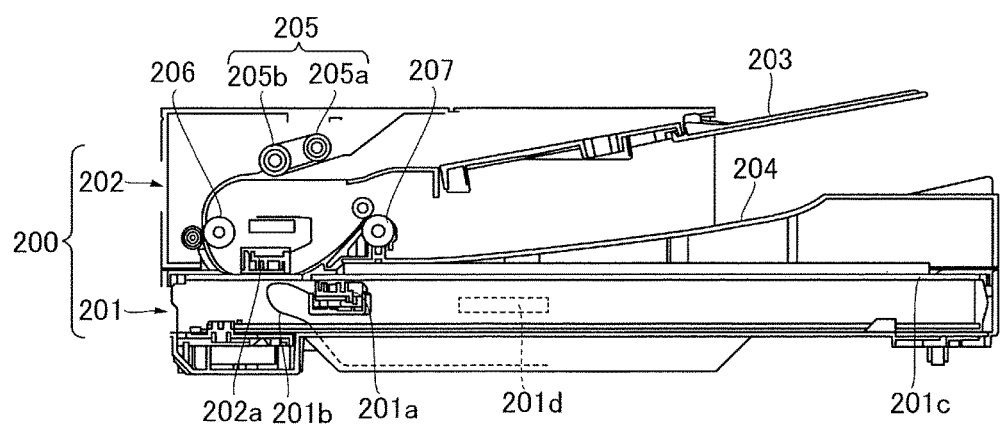
FIG. 3A is a schematic view illustrating a configuration of an image reading unit according to the first embodiment.

As illustrated in FIG. 3A, the scanner unit 201 is a flat-bed-type image reading apparatus including a first reading sensor 201a, and a platen glass 201c serving as a document placing plate. A contact image sensor (CIS) is used as the first reading sensor 201a, which is a first reading unit configured to read image information from a first surface of a document in the present embodiment. The first reading sensor 201a moves in a sub-scanning direction (right-left direction in FIG. 3A below the platen glass 201c while optically scanning the document placed on the platen glass 201c, and acquires image information as electronic signals through photoelectric conversion by image sensor elements. Other image reading mechanisms such as a charge coupled device (CCD) system can be used instead of the CIS.

Figure 3B:
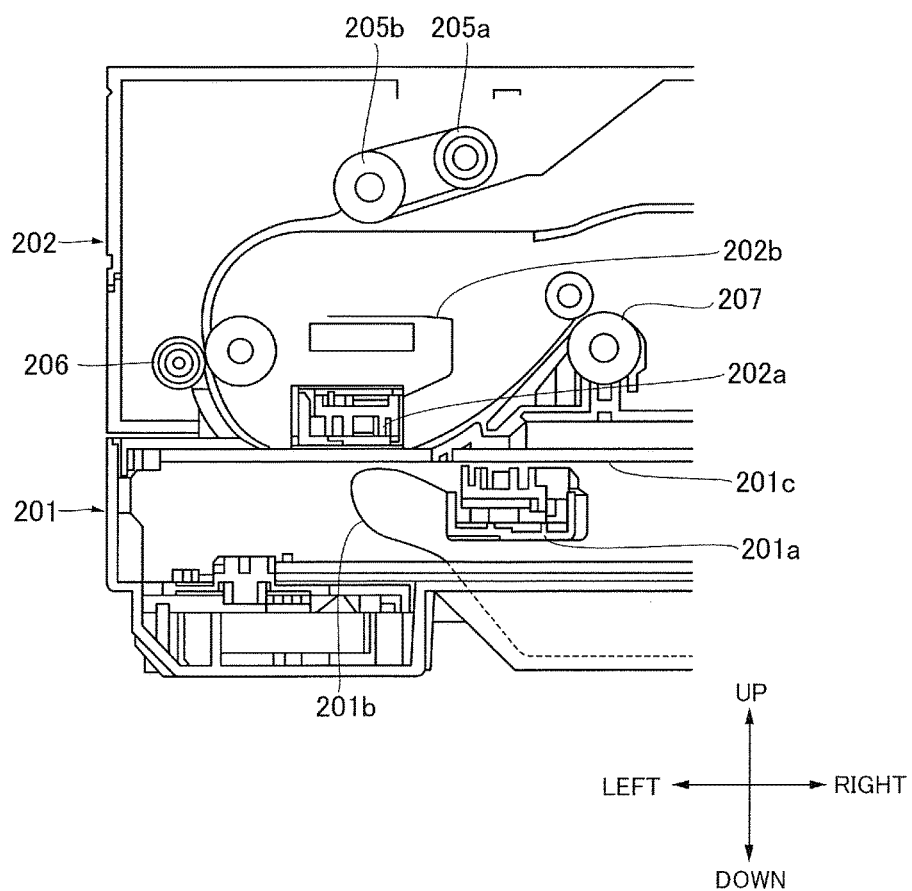
FIG. 3B is an enlarged view of the image reading unit according to the first embodiment.

The ADF 202 includes a second reading sensor 202a serving as a second reading unit to read image information from a second surface of the document and a pressing unit to press and hold the document placed on the platen glass 201c, and the ADF 202 has a function to automatically feed the document whose image is to be read. As illustrated in FIGS. 3A and 3B, the ADF 202 includes a document tray 203 on which a document is placed, a sheet feed unit 205 and a conveyance roller pair 206 configured to feed and convey the document from the document tray 203, and a sheet discharge tray 204 onto which the document is discharged.

The document placed on the document tray 203 is fed one sheet at a time by the sheet feed unit 205 equipped with a pickup roller 205a, a feed roller 205b, and a separating member such as a separating pad, and transferred to the conveyance roller pair 206. The conveyance roller pair 206 conveys the document through a conveyance path curved in a U-shape toward a reading position of the first and second reading sensors 201a and 202a. If a document is fed by the ADF 202, the first reading sensor 201a moves to the left side of the platen glass 201c in advance, and the first and second reading sensors 201a and 202a read images simultaneously from both surfaces of the document conveyed by the conveyance roller pair 206. The document from which the images have been read is discharged through a sheet discharge roller pair 207 onto the sheet discharge tray 204.

Next, we will describe the flow of electric signals conveying the image information read by the first and second reading sensors 201a and 202a. In the following description, FFC refers to a flexible flat cable in which conductors arranged in parallel are interposed between insulating films. The FFC is an example of a flat signal cable, and it can be replaced, for example, with a flexible printed circuit (FPC) formed on an insulating film as a base plate.

As illustrated in FIGS. 3A and 3B, the first and second reading sensors 201a and 202a are connected through FFCs 201b and 202b to a relay board 201d. The relay board 201d is built into a rear portion of the scanner unit 201 (refer to FIG. 2), and electric signals including the image information read by the first and second reading sensors 201a and 202a are transferred through the FFCs 201b and 202b collectively to the relay board 201d.

As illustrated in FIG. 4, the electric signals collected at the relay board 201d are transmitted through the FFCs 301 and 302 to the control board 101 of the apparatus body 100. The FFC 301 transmits the image information read by the first reading sensor 201a, and the FFC 302 transmits the image information read by the second reading sensor 202a. The terminals on one side of the FFCs 301 and 302 are connected to a connector not shown provided on the relay board 201d. The terminals on the other side of the FFCs 301 and 302 are connected to connectors 303 and 304 provided on the control board 101.

That is, according to the present embodiment, the image forming apparatus 10 serving as one example of an electronic apparatus is equipped with a wiring structure including the FFC 301 serving as a first signal cable and the FFC 302 serving as a second signal cable, which are respectively capable of transmitting electronic signals. The FFCs 301 and 302 connect the relay board 201d serving as a first control board and the control board 101 of the apparatus body 100 serving as a second control board. It is also possible to adopt a configuration in which the reading sensor and the control board 101 are connected directly, instead of the configuration in which the image information acquired by the first and second reading sensors 201a and 202a is transmitted through the relay board 201d to the control board 101. In other words, the first and second signal cables are not limited to the cables illustrated in the present embodiment connecting two control boards in parallel, but they can be any cable that transmits electronic signals between two sets of input/output ports.

Ferrite Core

Figure 5:
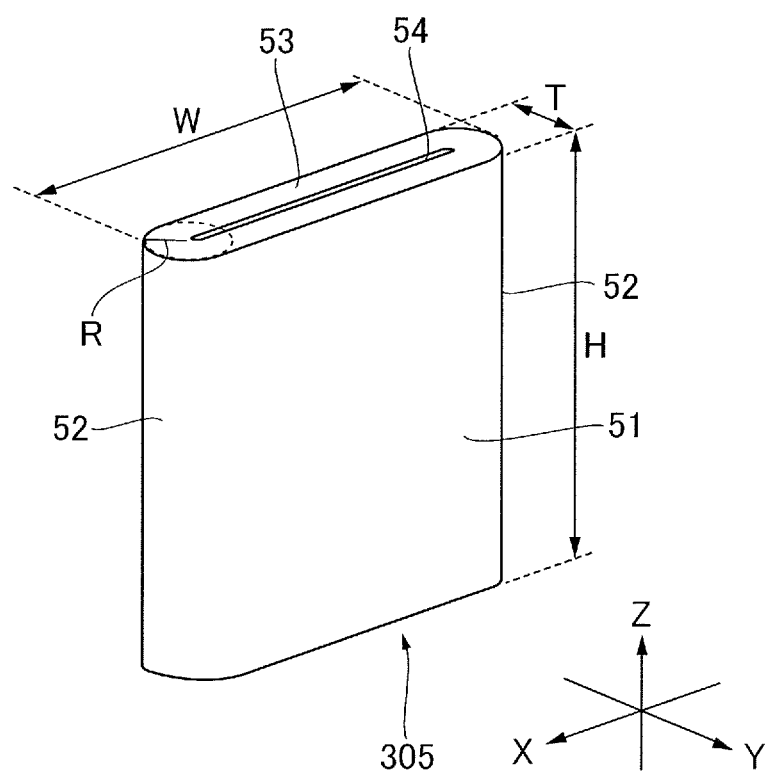
FIG. 5 is a perspective view of a ferrite core according to the first embodiment.

Now, a wiring path of the FFCs 301 and 302, and ferrite cores 305 and 306 capable of reducing noise transmitted to the control board 101 through the FFCs 301 and 302 will be described with reference to FIGS. 4 and 5. A ferrite core for noise suppression is also known as a ferrite bead or a ferrite choke. FIG. 4 is an enlarged view of a wiring structure near the ferrite cores 305 and 306, in which a portion of a housing 108 of the apparatus body 100 is eliminated. FIG. 5 is a perspective view of the ferrite core 305. The ferrite core 305 is a first magnetic member in this embodiment through which the FFC 301 serving as a first signal cable is passed, and the ferrite core 306 is a second magnetic member in this embodiment through which the FFC 302 serving as a second signal cable is passed.

In the present embodiment, the dimensions of the ferrite cores 305 and 306 are the same, so that the first ferrite core 305 is taken as an example to explain the shape thereof. As illustrated in FIG. 5, the ferrite core 305 is a flat plate shaped member in which a slit 54 serving as a hollow portion through which the FFC can be passed is formed. The ferrite core 305 has planar portions 51 formed on both sides of the ferrite core 305 in a thickness direction Y of the FFC passed through the slit 54. Further, end faces 53 on both side of the ferrite core 305 in a passing direction (height direction) Z of the FFC are planes perpendicular to the passing direction Z of the FFC, and the slit 54 is formed to open at a middle of the end faces 53 in the thickness direction Y. Side portions 52 and 52 on both sides in a width direction X of the ferrite core 305, that is, in a direction orthogonal to the passing direction Z and the thickness direction Y of the FFC, are formed as a curved surface curved in an arc when viewed from the passing direction Z. Hereafter, regarding the ferrite core 305, a size of thereof in the width direction X of the FFC is referred to as width W, the size thereof in the thickness direction Y of the FFC is referred to as thickness T, and the size thereof in the passing direction Z of the FFC is referred to as height H. In the description, it is assumed that the two ferrite cores 305 and 306 have the same dimensions (W, T, H), but it is also possible to use ferrite cores having different dimensions.

As illustrated in FIG. 4, a holder 400 is provided on the apparatus body 100 as a holder configured to hold the ferrite cores 305 and 306 through which the FFCs 301 and 302 are passed. The holder 400 is fixed, together with the control board 101, to the metal plate 105 (refer to FIG. 1) constituting the frame member of the apparatus body 100. The FFCs 301 and 302 are extended downward from a bottom face of the scanner unit 201, wired through the slits of the ferrite cores 305 and 306 held by the holder 400, and connected to connectors 303 and 304 positioned below the holder 400.

That is, the FFCs 301 and 302 are wired approximately in parallel in a state overlapping with each other when viewed in a thickness direction near the ferrite cores 305 and 306, with the up-down direction set as the wiring direction. When viewed from the left, the FFCs 301 and 302, the ferrite cores 305 and 306 and the connectors 303 and 304 are all arranged such that the middle positions thereof in the front-rear direction are aligned approximately in a straight line along the up-down direction. In order to shorten the wiring path, the control board 101 is arranged close to an upper portion of the apparatus body 100, and connectors 303 and 304 are arranged at an upper portion of the control board 101.

The ferrite cores 305 and 306 are composed of a soft magnetic ferrite, i.e., soft ferrite. Therefore, inductors are formed by the ferrite cores 305 and 306 and the FFCs 301 and 302 passed through the ferrite cores 305 and 306. Noise transmitted to the control board 101 can be reduced by the inductor acting as a low pass filter with respect to the current flowing through the FFCs 301 and 302. That is, each ferrite core 305 and 306 is equivalent to a core of a case where a conducting wire is wound in a coil shape around a magnetic member serving as the core to form an inductor. As long as an appropriate noise reduction effect is achieved, magnetic materials other than ferrite can be used as the first and second magnetic members. Soft magnetic material, which has a high resistance and is magnetized when an external magnetic field is applied and demagnetized as the intensity of the external magnetic field is reduced, is preferable as a material for noise reduction. In the present embodiment, a soft magnetic material capable of filtering noise with an application frequency of 30 MHz to 1 GHz is used.

Configuration for Holding Ferrite Cores

Figure 7:
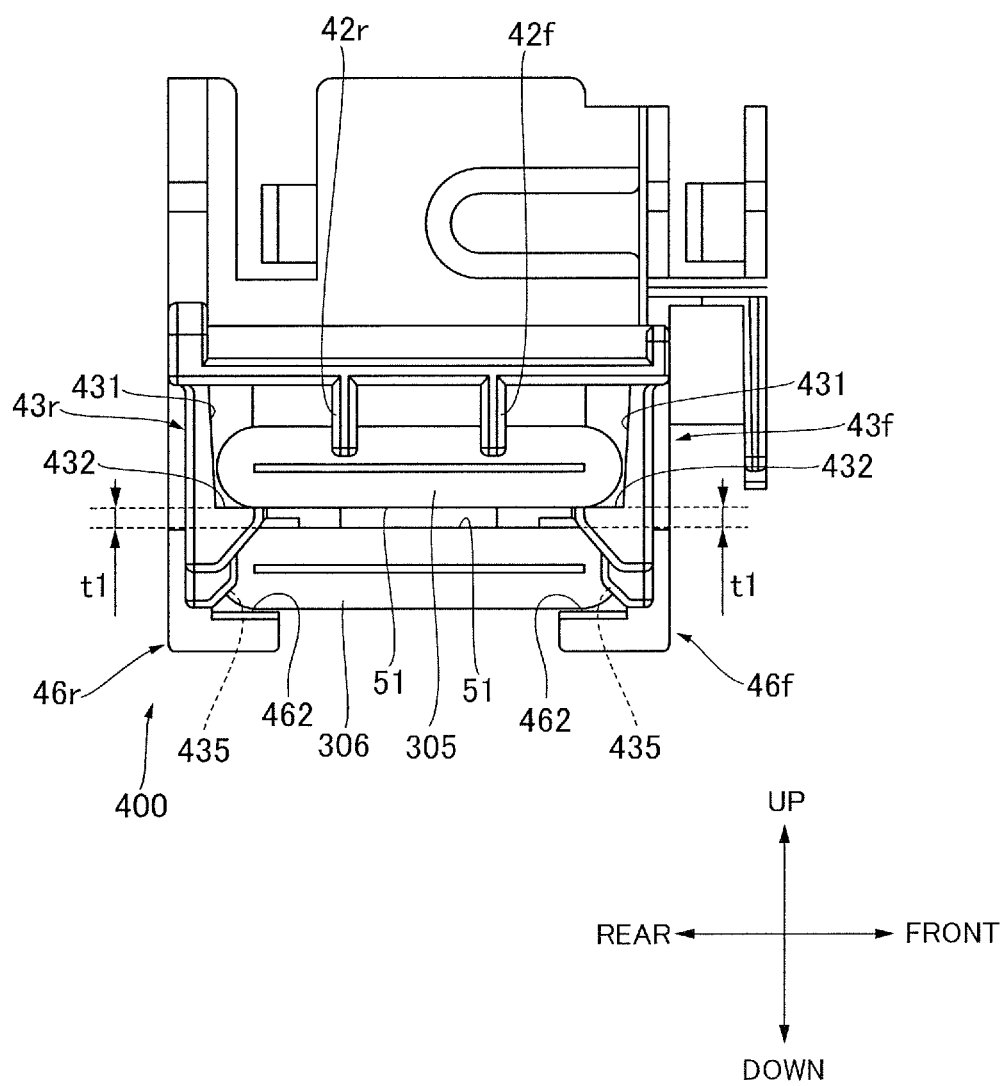
FIG. 7 is a top view of the holder according to the first embodiment.
Figure 8:
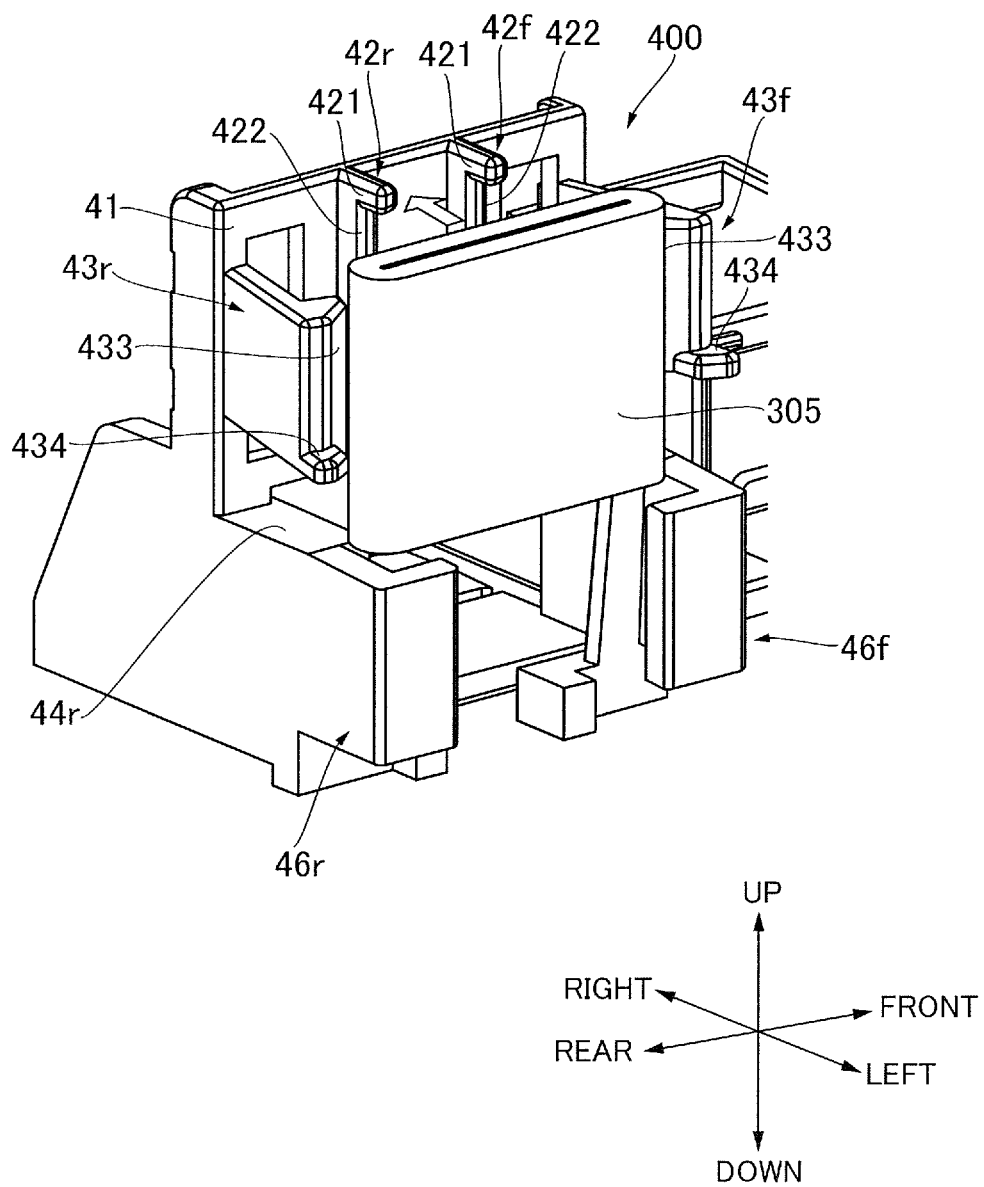
FIG. 8 is a perspective view illustrating a step of attaching a first ferrite core to the holder according to the first embodiment.
Figure 9:
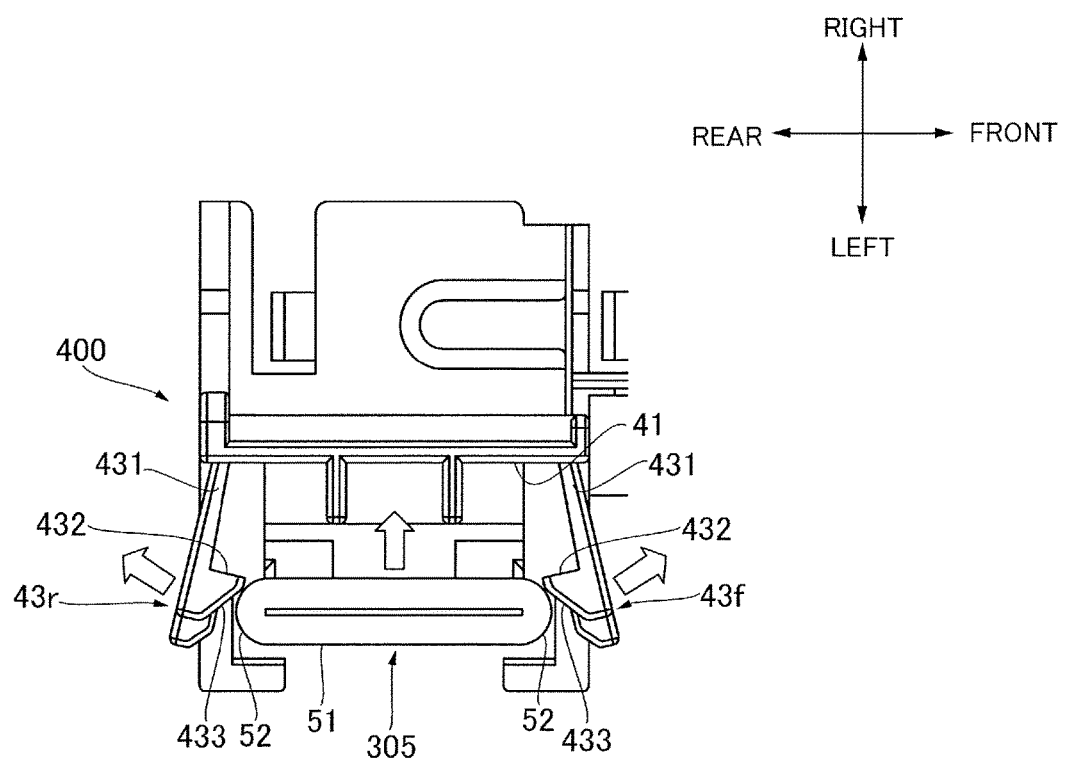
FIG. 9 is a top view illustrating the step of attaching the first ferrite core to the holder according to the first embodiment.
Figure 10:
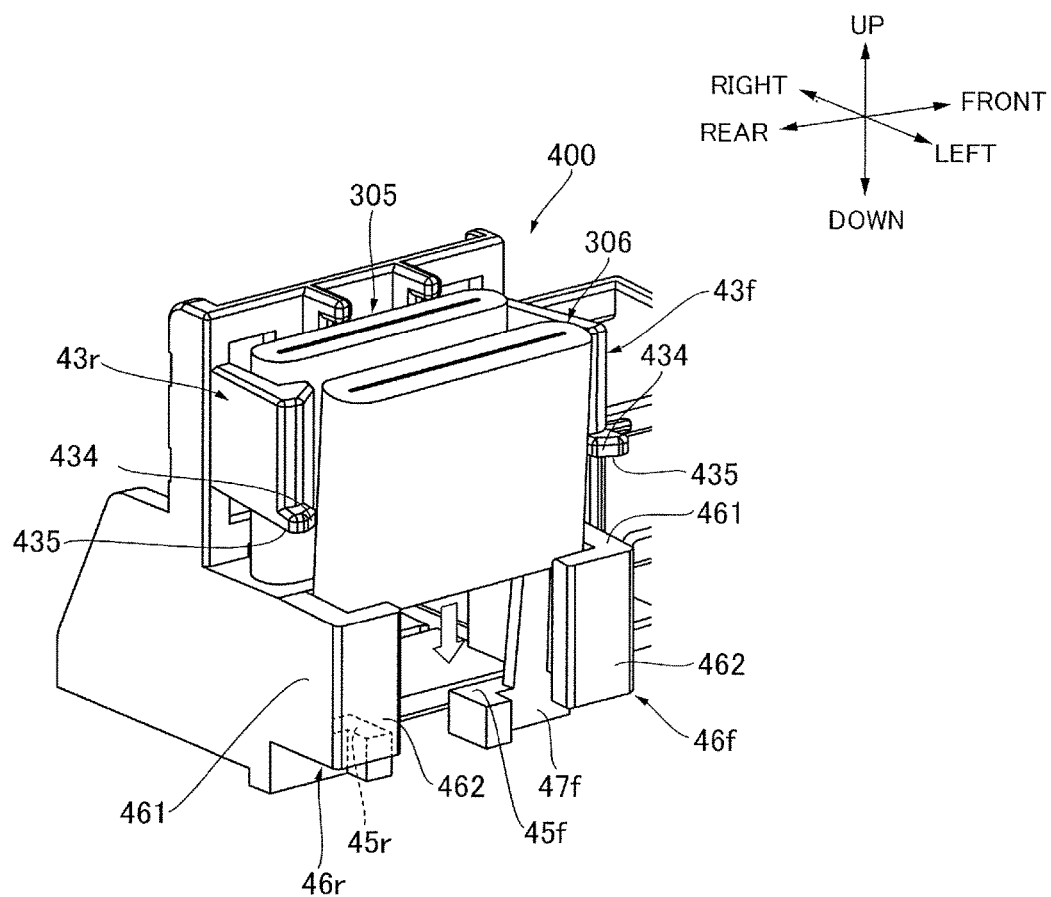
FIG. 10 is a perspective view illustrating a step of attaching a second ferrite core to the holder according to the first embodiment.
Figure 11:
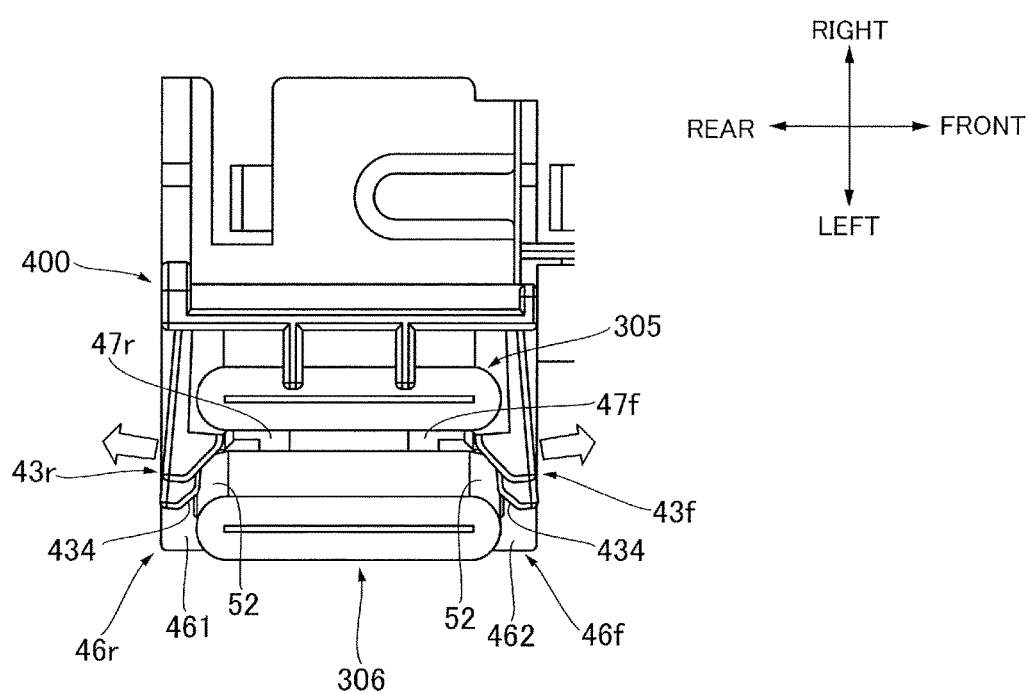
FIG. 11 is a top view illustrating the step of attaching the first ferrite core to the holder according to the first embodiment.

Next, a configuration of the holder 400 to hold the ferrite cores 305 and 306 will be described with reference to FIGS. 6A through 11. FIG. 6A is a perspective view of the holder 400, and FIG. 6B is a perspective view of the holder 400 to which the ferrite cores 305 and 306 are attached. FIG. 7 is a top view of the holder 400 to which the ferrite cores 305 and 306 are attached. FIG. 8 is a perspective view illustrating a step of attaching the first ferrite core 305, and FIG. 9 is a top view thereof. FIG. 10 is a perspective view illustrating a step of attaching the second ferrite core 306, and FIG. 11 is a top view thereof.

In FIGS. 6A through 11, the FFCs 301 and 302 are not illustrated, such that the positional relationship of the ferrite cores 305, 306 and the holder 400 is clarified. In the following description, the positional relationship of the ferrite cores 305, 306 and the holder 400 will be described with reference to front-rear, right-left and up-down directions in an assembled state of the image forming apparatus 10. That is, in the following description, the front-rear direction corresponds to a width direction of the ferrite cores 305 and 306, the right-left direction corresponds to a thickness direction of the ferrite cores 305 and 306, and the up-down direction corresponds to a height direction of the ferrite cores 305 and 306. The thickness direction of the ferrite cores 305 and 306 corresponds to a thickness direction of the FFCs 301 and 302.

As illustrated in FIG. 6A, the holder 400 includes a first holding portion 401 configured to hold the first ferrite core 305, and a second holding portion 402 configured to hold the second ferrite core 306. As illustrated in FIGS. 6B and 7, the first holding portion 401 holds the first ferrite core 305 on a back side of the holder 400, that is, on the right side of the image forming apparatus 10, in comparison to the second ferrite core 306 held by the second holding portion 402. Further, the first holding portion 401 holds the first ferrite core 305 at a position upward than the second ferrite core 306 held by the second holding portion 402 and overlapping with the second ferrite core 306 when viewed from the left side of the image forming apparatus 10. In the present embodiment, a length P2 of the overlap between the lower portion of the first ferrite core 305 and the second ferrite core 306 in the up-down direction is set to approximately one-third the height H of the ferrite cores 305 and 306.

As illustrated in FIG. 6A, the first holding portion 401 is composed of a first backside portion 41, first fixing portions 42$f$ and 42$r$, elastic hooks 43$f$ and 43$r$, and first support surfaces 44$f$ and 44$r$. The first backside portion 41 is a flat surface that spreads approximately perpendicularly with respect to the right-left direction, and in an attached state where the two cores 305 and 306 are attached to the holder 400, the first backside portion 41 opposes to one of the planar portions 51 of the ferrite core 305. The first fixing portions 42$f$ and 42$r$ each includes a rib 422 that protrudes toward the left side from the first backside portion 41 and extends in the up-down direction, and a projected portion 421 that protrudes to the left side from an upper end portion of the rib 422. In the attached state, the ribs 422 and 422 hold the planar portion 51 on the right side of the ferrite core 305, and the projected portions 421 and 421 hold an end face 53 on the upper side of the ferrite core 305. The first support surfaces 44$f$ and 44$r$ are flat surfaces that extend to the left side from a lower end portion of the first backside portion 41, and in the attached state, they holds an end face 53 on the lower side of the ferrite core 305.

The elastic hooks 43$f$ and 43$r$ serving as elastic engagement portions each includes an arm 431 that protrude to the left side from the first backside portion 41, and a claw 432 provided on a tip of the arm 431. The elastic hooks 43$f$ and 43$r$ are arranged in a pair in the width direction of the ferrite core 305, that is, in the front-rear direction. The claws 432 and 432 are provided with first inclined surfaces 433 and 433 whose width in the front-rear direction is narrowed toward the right, which is the attaching direction of the ferrite core 305, when viewed from the up-down direction. Accordingly, if the first inclined surfaces 433 and 433 are pressed by the ferrite core 305, the elastic hooks 43$f$ and 43$r$ are elastically deformed in the front-rear direction to thereby be engaged with the ferrite core 305. In the attached state, the elastic hooks 43$f$ and 43$r$ hold the side portions 52 and 52 on the front and rear sides of the ferrite core 305 by the arms 431, and hold the planar portion 51 on the left side of the ferrite core 305 by the claws 432. In other words, the first holding portion 401 includes a first elastic engagement portion (43$f$) holding one end of the ferrite core 305 in the width direction of the ferrite core 305, and a second elastic engagement portion (43$r$) holding the other end of the ferrite core 305 in the width direction of the ferrite core 305.

That is, the first holding portion 401 is configured in a recessed shape that opens to the left side, which is a first direction in this embodiment, and the ferrite core 305 can be attached to the first holding portion 401 by moving the ferrite core 305 toward the right. As illustrated in FIGS. 8 and 9, when attaching the ferrite core 305, an end face 53 on the lower side of the ferrite core 305 is matched with the height of the first support surfaces 44$f$ and 44$r$, and in a state where the side portions 52 and 52 on both sides thereof are abutted against the first inclined surfaces 433 and 433 of the elastic hooks 43$f$ and 43$r$, the ferrite core 305 is pushed in toward the right. Then, the arms 431 and 431 are elastically deformed by the ferrite core 305 pushing the first inclined surfaces 433 and 433, and the elastic hooks 43$f$ and 43$r$ being pushed will be bent away from each other in the front-rear direction. Then, in a state where the ferrite core 305 passes the claws 432 and 432 and reaches a position in contact with the ribs 422 and 422, the elastic hooks 43$f$ and 43$r$ are restored, and the ferrite core 305 will be in a state held by the first holding portion 401. In this situation, the claws 432 and 432 are positioned to overlap with the ferrite core 305 when viewed from the left, and restrict movement of the ferrite core 305 in a direction to move away from the recessed portion, that is, to the left.

In the attached state, as illustrated in FIG. 6B, the first ferrite core 305 and the second ferrite core 306 will be in a state overlapping with each other over a predetermined length P2 in the up-down direction when viewed from the left. In other words, the holder 400 is configured such that one of the planar portions 51 of the first ferrite core 305 and one of the planar portions 51 of the second ferrite core 306 are configured to be opposed to one another in the thickness direction of the FFCs inserted to the ferrite cores 305 and 306. Therefore, in the attached state, the first ferrite core 305 is restricted from moving in the direction away from the first holding portion 401 (i.e., the left direction) by being engaged with the elastic hooks 43$f$ and 43$r$ and also by the second ferrite core 306 held in the second holding portion 402.

As illustrated in FIG. 7, in the attached state, a gap t1 is formed between the planar portion 51 of the first ferrite core 305 and the planar portion 51 of the second ferrite core 306 opposed thereto. The width of the gap t1 should preferably be as small as possible from the viewpoint of reducing movement space, i.e., backlash, of the first ferrite core 305 in the attached state, as long as the attaching process of the second ferrite core 306 described later is not hindered. Especially, the width of gap t1 should be smaller than a radius R (refer to FIG. 5) of arc-shaped side portions 52 of the first ferrite core 305. In the present embodiment, the R of the ferrite cores 305 and 306 is set to 2.5 mm, and the width of the gap t1 is set to 1.5 mm.

As illustrated in FIG. 6A, the second holding portion 402 is composed of second backside portions 47$f$ and 47$r$, second fixing portions 46$f$ and 46$r$, and second support surfaces 45$f$ and 45$r$. The second backside portions 47$f$ and 47$r$ are flat surfaces that extend downward from left end portions of the first support surfaces 44$f$ and 44$r$ and spread approximately perpendicularly with respect to the right-left direction. In the attached state, the second backside portions 47$f$ and 47$r$ are opposed to one of the planar portions 51 of the ferrite core 306. Each of the second fixing portions 46$f$ and 46$r$ include a side part 461 that protrudes to the left side from the corresponding second backside portion 47$f$ or 47$r$, and a front part 462 that extends from an end portion of the side part 461 in the front-rear direction and opposes to the corresponding second backside portion 47$f$ or 47$r$. In the attached state, the side parts 461 hold the right and left side portions 52 and 52 of the ferrite core 306, and the front parts 462 and 462 hold the other planar portion 51 of the ferrite core 306. The second support surfaces 45*f* and 45*r* are flat surfaces that extend to the left side from respective lower end portions of the second backside portions 47*f* and 47*r*, and in the attached state, they hold an end face 53 on a lower side of the ferrite core 306. The ferrite core 306 is fit into spaces 48 and 48 (i.e., groove portions) formed, or defined, by the second fixing portions 46*f* and 46*r* and the second backside portions 47*f* and 47*r*. That is, front part 462 of the second fixing portions 46*f* and 46*r* and the second backside portions 47*f* and 47*r* serve as a thickness-direction restrict portion that restricts movement of the ferrite core 306 in the thickness direction. Further, the side parts 461 and 461 of the second fixing portions 46*f* and 46*r* serve as a width-direction restrict portion that restricts movement of the ferrite core 306 in the width direction.

Further, lower end portions 435 and 435 of the elastic hooks 43*f* and 43*r* serve as restrict portions capable of restricting movement of the ferrite core 306 held by the second holding portion 402. That is, as illustrated in FIGS. 6B and 7, in the attached state, the lower end portions 435 are positioned to overlap with an upper side end face 53 of the ferrite core 306 when viewed from above. Furthermore, as illustrated in FIG. 6A, second inclined surfaces 434 and 434 serving as abutting surfaces capable of abutting against the ferrite core 306 are provided on lower portions of the elastic hooks 43*f* and 43*r*. The second inclined surfaces 434 and 434 protrude to the left side as compared to the first inclined surfaces 433 and 433, and are inclined such that the width thereof in the front-rear direction is reduced toward the right. Therefore, if pressed by the second inclined surfaces 434 and 434, the lower end portions 435 and 435 retract from a locus of movement of the ferrite core 306 by the elastic hooks 43*f* and 43*r* elastically deforming in the front-rear direction.

That is, the second holding portion 402 is configured as a recessed portion that is opened toward the upper side, which is a second direction in this embodiment, and the ferrite core 306 can be attached to the second holding portion 402 by moving the ferrite core 306 downward. As illustrated in FIGS. 10 and 11, the ferrite core 306 is pushed downward in a state slightly inclined toward the right as it extends downward, to be attached to the second holding portion 402 through an opening portion formed by the second fixing portions 46*f* and 46*r* and the second backside portions 47*f* and 47*r*. In this process, the second inclined surfaces 434 and 434 are pressed by the ferrite core 306, and the ferrite core 306 moves down while the elastic hooks 43*f* and 43*r* being pushed and slightly bended away from each other in the front-rear direction. When the ferrite core 306 passes lower end portions of the elastic hooks 43*f* and 43*r*, the elastic hooks 43*f* and 43*r* are restored, and the ferrite core 306 comes to be held by the second holding portion 402. In this state, lower end portions 435 and 435 of the elastic hooks 43*f* and 43*r* are positioned to overlap with an upper side end face 53 of the ferrite core 306 when viewed from the upper direction, and the lower end portions 435 and 435 restrict movement of the ferrite core 306 in a direction to move away from the recessed portion of the second holding portion 402, that is, in the upper direction.

Here, as illustrated in FIG. 6A, the arms 431 and 431 of the elastic hooks 43*f* and 43*r* are plate-shaped members that extend perpendicularly with respect to the front-rear direction, and the level of the flexural rigidity differs depending on the direction of the external force. That is, each arm 431 has a rectangular cross-sectional shape whose length in the up-down direction, or the attaching direction of the second ferrite core 306, is set longer than that in the front-rear direction in a cross-section perpendicular to the right-left direction, or the attaching direction of the first ferrite core 305. In other words, in a plane perpendicular to the left direction as a first direction, the cross-sectional shape of the arms 431 have a length in the up-down direction as the second direction that is longer than a length in the deforming direction, as a third direction, of the elastic hooks 43*f* and 43*r* that intersect the second direction.

Accordingly, the arms 431 and 431 elastically deform relatively easily in the front-rear direction, or the direction of movement of the claws 432 and 432 when attaching the first ferrite core 305. Meanwhile, the arms 431 and 431 are not easily elastically deformed in the up-down direction, or the attaching direction of attaching the second ferrite core 306. Therefore, in a state where the ferrite core 306 is held by the second holding portion 402, even if an external force pushing the ferrite core 306 upward is applied, the deformation of the elastic hooks 43*f* and 43*r* is suppressed to a minimum. Therefore, the ferrite core 306 will be retained by lower end portions 435 and 435 of the elastic hooks 43*f* and 43*r*, and prevented from falling out of the second holding portion 402.

Moreover, a height P1 between the lower end portions 435 and the second support surfaces 45*f* and 45*r* in the up-down direction is set somewhat greater than the height H of the ferrite core 306, and set to a value as close to H as possible within the range not hindering the attaching operation and the like. In the present embodiment, P1 is set 1 mm greater than H. The cross-sectional shape of an elastic hook is not restricted to a rectangular shape, and for example, a shape can be adopted in which a moment of inertia of area, with respect to an axis that passes a centroid of a cross-section as viewed from the left and extending in the front-rear direction, is set greater than a moment of inertia of area with respect to another axis that also passes the centroid and extends in the up-down direction. Further, the flexural rigidity can be differentiated depending on directions of external force by using a material having directivity, such as a corrugated plastic, to form the arms 431.

As descried, according to the present embodiment, in a state where the ferrite cores 305 and 306 are attached to the holder 400, the two ferrite cores 305 and 306 are arranged to overlap with one another when viewed from the attaching direction of the first ferrite core 305. In other words, the second holding portion 402 holds the second ferrite core 306 at a position where the second ferrite core 306 overlaps with the first ferrite core 305 at a position apart from the elastic hooks 43*f* and 43*r* when viewed from the left. Therefore, the first ferrite core 305 will be held not only by the elastically deformable elastic hooks 43*f* and 43*r* but also by the second ferrite core 306.

Further, a configuration is adopted in which the lower end portions 435 and 435 of the elastic hooks 43*f* and 43*r* function as a restrict portion that restricts the second ferrite core 306 held by the second holding portion 402 from moving upward. That is, a configuration is adopted in which the elastic hooks 43*f* and 43*r* also function to lock the two ferrite cores 305 and 306. Therefore, the possibility of detachment of the two ferrite cores 305 and 306 can be reduced, even if these cores received external force such as shock caused by dropping or vibration of the apparatus. Furthermore, pressing force necessary to elastically deform the elastic hooks 43*f* and 43*r* is small compared to a case where the stiffness of the elastic hooks 43*f* and 43*r* are increased to enhance holding force, such that the workability of the attaching operation can be ensured while preventing damage of the ferrite core. The configuration of the present embodiment is especially effective when a soft magnetic material, which is often fragile to shock and vulnerable to cracking and chipping, is used for noise reduction.

Further, a configuration is adopted in which the first ferrite core 305 is attached to the first holding portion 401 by being pushed in from a first direction, i.e., left, and the second ferrite core 306 is attached to the second holding portion 402 from a second direction, i.e., upper direction, that intersects the first direction. In the attached state, the second ferrite core 306 is arranged to overlap with the first ferrite core 305 at a position lower (i.e., upstream in the second direction) than the elastic hooks 43f and 43r. According to this configuration, the space on the left side of the first holding portion 401 can be utilized as a workspace for performing attaching operation of the two ferrite cores 305 and 306. Therefore, the workability of wiring operation can be ensured even in a case where the wiring path is short, and the present configuration contributes to downsizing the image forming apparatus.

Specifically, the arms 431 and 431, which are portions that mainly deform elastically in the elastic hooks 43f and 43r, are configured such that the flexural rigidity thereof with respect to the external force in the front-rear direction is smaller, while the flexural rigidity with respect to the external force in the up-down direction, or the attaching direction of the second ferrite core 306, is greater. This configuration enables to minimize reaction force against attachment of the first ferrite core 305, while even further reducing the possibility of the second ferrite core 306 being detached to the upper direction from the second holding portion 402. According further to the present embodiment, the attachment operations of the two ferrite cores 305 and 306 are both performed through elastic deformation of the elastic hooks 43f and 43r due to the functions of the first and second inclined surfaces 433 and 434, such that the attaching operations of the ferrite cores 305 and 306 are facilitated.

According to the present embodiment, the two signal cables are both flat shaped FFCs, but it is also possible to adopt a configuration where one or both signal cables are linear signal cables, and a ferrite core having a corresponding shape, such as a cylindrical shape, is used. It should be noted that by adopting a configuration as described in the present embodiment where the flat ferrite cores 305 and 306 overlap with each other in the thickness direction, both the improvement of transmission speed of electronic signals, such as the image information read by the image reading unit 200, and the downsizing of the image forming apparatus can be achieved.

Second Embodiment

Next, a wiring structure according to a second embodiment will be described with reference to FIGS. 12A and 12B. The wiring structure according to the present embodiment differs from that of the first embodiment in that interposed members 49f and 49r that function as spacers between the two ferrite cores 305 and 306 are arranged on the elastic hooks 43f and 43r. The other configurations are similar to the first embodiment, so elements that are common to the first embodiment are denoted with the same reference numbers, and descriptions thereof are omitted.

Figure 12A:
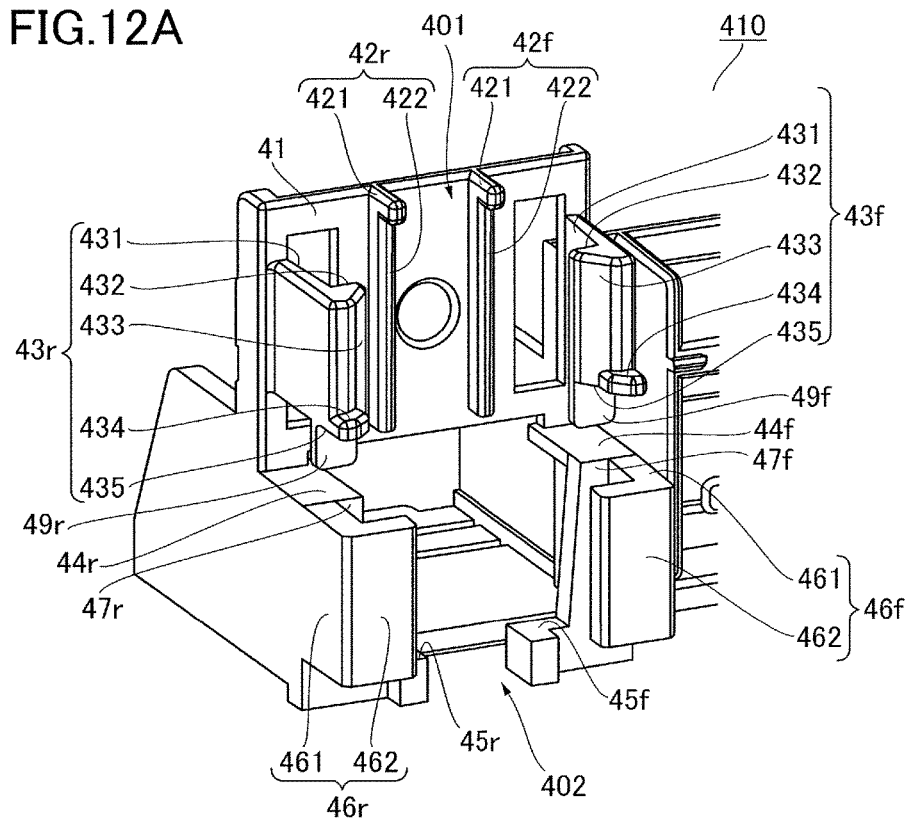
FIG. 12A is a perspective view of a holder according to a second embodiment.
Figure 12B:
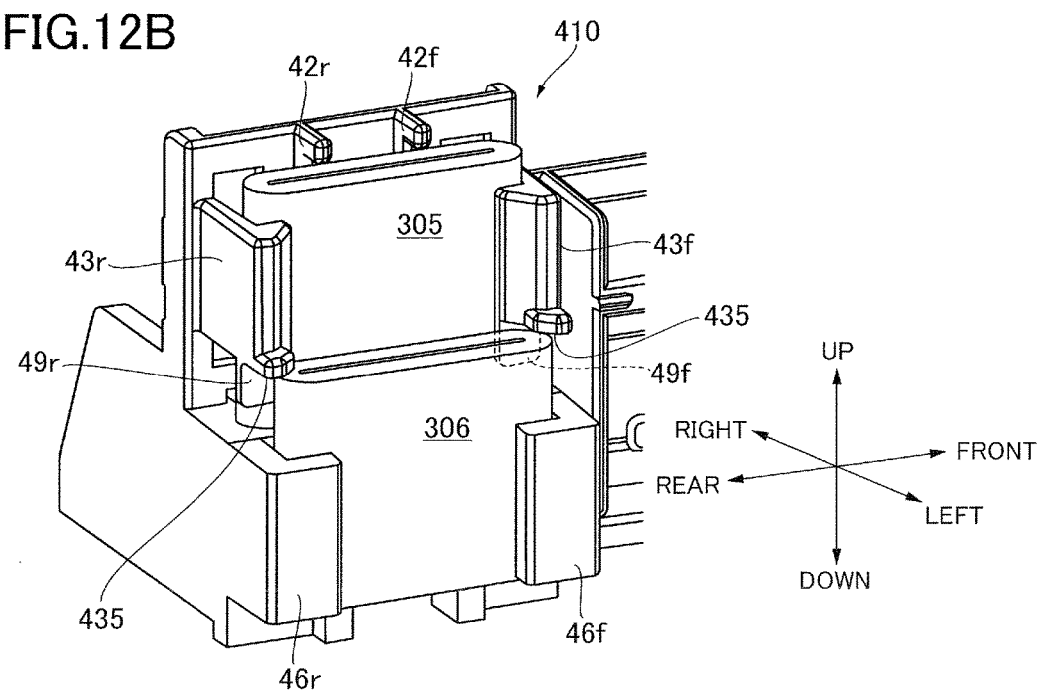
FIG. 12B is a perspective view of the holder in a state where the ferrite core is attached to the holder according to the second embodiment.

As illustrated in FIGS. 12A and 12B, a holder 410 serving as a holder according to the present embodiment includes the first holding portion 401 to hold the first ferrite core 305 and the second holding portion 402 to hold the second ferrite core 306. Similar to the first embodiment, the ferrite cores 305 and 306 are held in a state partially overlapping with one another when viewed from the left, and movement of the first ferrite core 305 to the left is restricted by the second ferrite core 306. Further, the lower end portions 435 and 435 of the elastic hooks 43f and 43r function as restrict portions that restrict movement of the ferrite core 306 held by the second holding portion 402 to the upper direction.

In the present embodiment, the holder 410 includes plate-like interposed members 49f and 49r that protrude downward from the elastic hooks 43f and 43r. With reference to FIG. 7, the interposed members 49f and 49r have an approximately equivalent thickness as a gap t1 between opposing planar portions 51 and 51 of the ferrite cores 305 and 306, and in a state where the ferrite cores 305 and 306 are attached, the interposed members 49f and 49r are interposed between the planar portions 51 and 51.

According to the configuration of the first embodiment, there is a small possibility that the first ferrite core 305 moves to the left side by the distance of gap t1 in an area not overlapping with the elastic hooks 43f and 43r when viewed from the left. Therefore, it was necessary to take notice of the possibility of the first ferrite core 305 colliding against the second ferrite core 306 by vibration of the apparatus, or the possibility of the first ferrite core 305 falling out of the first holding portion 401 by the change of position of the first ferrite core 305. According to the present embodiment, if the first ferrite core 305 attempts to move left, the second ferrite core 306 will be pressed against the interposed members 49f and 49r. But since the second ferrite core 306 is held by the front parts 462 of fixing portions 46f and 46r serving as fixing members, the movement of the first ferrite core 305 to the left will be restricted.

That is, due to the function of the interposed members 49f and 49r, it becomes possible to reduce the possibility of displacement of the first ferrite core 305 compared to the configuration of the first embodiment, and to prevent falling of the first ferrite core 305 in a case where external shock by vibration or dropping of the apparatus is received. Further, since the interposed members 49f and 49r function as a buffer member, the possibility of damages of ferrite cores 305 and 306 caused by the collision can be reduced.

Other Embodiments

The first and second embodiments described above have illustrated a wiring structure of the FFC that connects the relay board of the image reading unit and the control board of the apparatus body, but the present technology is applicable for a wiring structure of other parts of the image forming apparatus. Moreover, this technology is not limited to image forming apparatuses and can be applied as a wiring structure in other general electronic apparatuses.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-014633, filed on Jan. 30, 2017, which is hereby incorporated by reference wherein in its entirety.

What is claimed is:

1. A wiring structure for an electronic apparatus comprising:
 a first signal cable and a second signal cable each configured to transmit an electronic signal;

a first magnetic member which comprises soft magnetic material and through which the first signal cable is passed;

a second magnetic member which comprises soft magnetic material and through which the second signal cable is passed; and a holder configured to hold the first and second magnetic members, the holder comprising:

a first holding portion configured to hold the first magnetic member and comprising an elastic engagement portion that is configured to engage with the first magnetic member by deforming elastically upon being pressed by the first magnetic member;

a second holding portion to which the second magnetic member is attached in a state where the first magnetic member is held by the first holding portion, the second holding portion being configured to hold the second magnetic member at a position where the second magnetic member overlaps with the first magnetic member at a position apart from the elastic engagement portion when viewed in a moving direction of the first magnetic member in which the first magnetic member is attached to the first holding portion; and a restrict portion arranged on the elastic engagement portion and configured to restrict movement of the second magnetic member in a state where the second magnetic member is held by the second holding portion.

2. The wiring structure according to claim 1, wherein the first holding portion comprises a shape opening toward a first direction such that the first magnetic member is attached to the first holding portion from the first direction, wherein the second holding portion comprises a shape opening toward a second direction intersecting the first direction such that the second magnetic member is attached to the second holding portion from the second direction, the second holding portion being configured to hold the second magnetic member at a position where the second magnetic member overlaps with the first magnetic member at a position upstream of the elastic engagement portion in the second direction when viewed in the first direction, and wherein the restrict portion is arranged at an upstream end of the elastic engagement portion in the second direction, and is configured to restrict the second magnetic member held by the second holding portion from moving in the second direction.

3. The wiring structure according to claim 2, wherein the elastic engagement portion comprises two elastic members arranged respectively on one side and the other side of the first holding portion in a third direction that intersects the second direction when viewed from the first direction, wherein in a case where the first magnetic member is moved toward the first holding portion from the first direction, the two elastic members are elastically deformed respectively to one side and to the other side of the third direction so as to engage with the first magnetic member, and wherein a flexural rigidity of each of the two elastic members with respect to an external force in the second direction is greater than that with respect to an external force in the third direction.

4. The wiring structure according to claim 3, wherein each of the two elastic members comprises an arm extending in the first direction and a claw supported on the arm and arranged to overlap with the first magnetic member in a state being held by the first holding portion when viewed from the first direction, and wherein when viewed in a cross section perpendicular to the first direction, a length of each arm in the second direction is greater than that in the third direction.

5. The wiring structure according to claim 2, wherein the elastic engagement portion comprises an abutting surface abuttable with the second magnetic member in a case of the second magnetic member being moved in the second direction toward a position for being held by the second holding portion, wherein in a case of attaching the second magnetic member to the second holding portion, the elastic engagement portion deforms elastically by the second magnetic member pressing the abutting surface such that the restrict portion retracts from a locus of the second magnetic member, and wherein in a state where the second magnetic member is held by the second holding portion, the restrict portion is retained, by elasticity of the elastic engagement portion, at a position overlapping with the second magnetic member when viewed from the second direction.

6. The wiring structure according to claim 1, wherein the first and second signal cables are flat cables facing each other in a thickness direction, wherein each of the first and second magnetic members is a flat shape comprising planar portions which spread approximately perpendicularly with respect to the thickness direction of the first and second signal cables and which are provided on both sides of a corresponding flat cable among the first and second signal cables in the thickness direction, and wherein the first and second magnetic members are held by the holder in a state overlapping with each other in the thickness direction.

7. The wiring structure according to claim 6, wherein the holder comprises an interposed member comprising a flat plate and supported by the elastic engagement portion, the interposed member being interposed between the planar portions of the first and second magnetic members that are opposed to each other in a state where the first and second magnetic members are held respectively by the first and second holding portions.

8. The wiring structure according to claim 6, wherein the first and second signal cables are wired through the first and second magnetic members held by the holder so as to extend approximately in parallel while overlapping with each other when viewed from the thickness direction.

9. The wiring structure according to claim 1, wherein each of the first and second signal cables is either a flexible flat cable or a flexible printed circuit.

10. A wiring structure for an electronic apparatus comprising:

a flat first signal cable and a flat second signal cable each configured to transmit an electronic signal;

a flat first magnetic member comprising soft magnetic material and provided with a hollow portion through which the first signal cable is passed;

a flat second magnetic member comprising soft magnetic material and provided with a hollow portion through which the second signal cable is passed; and a holder configured to hold the first magnetic member with the first signal cable being passed and to hold the second magnetic member with the second signal cable being passed, the holder comprising:
a first holding portion configured to hold the first magnetic member; and
a second holding portion configured to hold the second magnetic member,
wherein the holder is configured such that the first and second magnetic members are held respectively by the first and second holding portions at positions overlapping with each other when viewed from a thickness direction of the first magnetic member,
wherein the first holding portion comprises a first elastic engagement portion and a second elastic engagement portion each elastically deformable in a width direction of the first magnetic member, where the width direction is orthogonal to both of the thickness direction and a height direction of the first magnetic member being held by the first holding portion, the first and second elastic engagement portions being configured to respectively hold one end and the other end of the first magnetic member in the width direction of the first magnetic member,
wherein the second holding portion comprises a thickness-direction restrict portion and a width-direction restrict portion, the thickness-direction restrict portion being configured to restrict movement of the second magnetic member in a thickness direction of the second magnetic member being held by the second holding portion, the width-direction restrict portion being configured to restrict movement of the second magnetic member in a width direction orthogonal to both of the thickness direction and a height direction of the second magnetic member being held by the second holding portion, and
wherein each of the first and second elastic engagement portions is provided with a restrict portion configured to restrict movement of the second magnetic member in the height direction of the second magnetic member in a state where the second magnetic member is held by the second holding portion.

11. The wiring structure according to claim 10, wherein the second magnetic member is placed in a groove portion defined by the thickness-direction restrict portion and the width-direction restrict portion.

12. An image forming apparatus comprising:
an image forming unit configured to form an image on a sheet; and
a wiring structure comprising:

a first signal cable and a second signal cable each configured to transmit an electronic signal;
a first magnetic member which comprises soft magnetic material and through which the first signal cable is passed;
a second magnetic member which comprises soft magnetic material and through which the second signal cable is passed; and
a holder configured to hold the first and second magnetic members, the holder comprising:
a first holding portion configured to hold the first magnetic member and comprising an elastic engagement portion that is configured to engage with the first magnetic member by deforming elastically upon being pressed by the first magnetic member;
a second holding portion to which the second magnetic member is attached in a state where the first magnetic member is held by the first holding portion, the second holding portion being configured to hold the second magnetic member at a position where the second magnetic member overlaps with the first magnetic member at a position apart from the elastic engagement portion when viewed in a moving direction of the first magnetic member in which the first magnetic member is attached to the first holding portion; and
a restrict portion arranged on the elastic engagement portion and configured to restrict movement of the second magnetic member in a state where the second magnetic member is held by the second holding portion.

13. The image forming apparatus according to claim 12, further comprising:
an image reading unit comprising a first reading unit configured to read image information from a first surface of an original and a second reading unit configured to read image information from a second surface opposite to the first surface of the original;
an apparatus body accommodating the image forming unit; and
a control board mounted in the apparatus body and configured to control the image forming unit to form an image based on image information read by the first and second reading units on the sheet,
wherein the first and second signal cables each connect the image reading unit and the control board such that image information read by the first reading unit is transmitted to the control board through the first signal cable and image information read by the second reading unit is transmitted to the control board through the second signal cable.

* * * * *